United States Patent [19]

Brown et al.

[11] Patent Number: 5,321,700
[45] Date of Patent: Jun. 14, 1994

[54] HIGH SPEED TIMING GENERATOR

[75] Inventors: Benjamin J. Brown, Westlake Village; Peter A. Reichert, Newbury Park, both of Calif.

[73] Assignee: Teradyne, Inc., Boston, Mass.

[21] Appl. No.: 605,977

[22] Filed: Oct. 30, 1990

Related U.S. Application Data

[63] Continuation-in-part of Ser. No. 419,699, Oct. 11, 1989.

[51] Int. Cl.[5] .......................... G06F 11/00; G01R 31/28
[52] U.S. Cl. ...................................... 371/27; 375/106; 307/269
[58] Field of Search .......................... 371/27; 307/269; 375/106, 66

[56] References Cited

U.S. PATENT DOCUMENTS

| | | | |
|---|---|---|---|
| 4,500,993 | 2/1985 | Jacobson | 371/16 |
| 4,727,312 | 2/1988 | Fulks | 371/27 |

*Primary Examiner*—Robert W. Beausoliel, Jr.
*Assistant Examiner*—Ly V. Hua

[57] ABSTRACT

A high speed timing generator including a pattern generator circuit, a plurality local generator circuits associated with respective nodes of a device under test, and a plurality of distribution paths. The pattern generator circuit has a high speed pattern generator which generates a high speed address and a divider circuit which divides the high speed address into a plurality of lower speed address patterns at a lower frequency. Each local generator circuit has a plurality of signal generator circuits which operate at the lower frequency of the lower speed address patterns and provide lower frequency signals and a high speed formatter circuit which uses the lower frequency signals to provide a high frequency signal. The plurality of distribution paths provide the lower speed address patterns to the local generator circuit.

54 Claims, 8 Drawing Sheets

HIGH SPEED TIMING GENERATOR

This application is a continuation-in-part of U.S. Pat. application Ser. No. 07/419,699, filed on Oct. 11, 1989 by Benjamin J. Brown and Peter A. Reichert and assigned to Teradyne, Inc.

BACKGROUND OF THE INVENTION

The invention relates to timing generators.

It is known to generate patterns which are used in automatic test equipment by providing a high speed pattern generator which generates address sequences which are sent to a plurality of local generator circuits. Each local generator circuit includes a high speed local memory, a pair of timing generators, a pair of corresponding interpolators, a high speed formatter and a high speed fail processor. The timing generators and interpolators run in an interleaved fashion, with one timing generator/interpolator set receiving and generating all even cycle information and the other set receiving and generating all odd information.

SUMMARY OF THE INVENTION

It has been discovered that providing a pattern generator circuit with a high speed pattern generator which generates a high speed address and a divider circuit which divides the high speed address into a plurality of lower speed address patterns, a local generator circuit having a plurality of signal generator circuits which operate at the lower frequency of the lower speed address patterns, and provide lower frequency signals and a high speed formatter circuit which uses the lower frequency patterns to provide a high frequency signal, and a plurality of distribution paths which provide the lower speed address patterns to the local generator circuit provides a timing generator in which signals may be distributed to the local generator circuit at lower frequencies.

In preferred embodiments the divider circuit cyclically provides the lower speed address patterns, the lower speed address patterns are provided in a sequence determined by the high speed address pattern, and/or the local generator circuit includes a plurality of signal generator circuits which operate at the lower frequency and provide lower frequency signals to a high speed formatter which provides the high frequency signal. Additionally, in preferred embodiments, each signal generator circuit may include a timing generator configured to receive information related to the lower speed address patterns and to provide timing generator information and an interpolator circuit configured to receive the timing generator information and to provide the lower frequency signal, and the timing generator information may be provided to the interpolator circuit using a clock generated by the interpolator circuit.

It has also been discovered that providing a register circuit configured to receive and hold input timing data, a pulse swallower circuit configured to delay the timing data by an amount set forth by the timing generator, a ramping circuit configured to receive the pulse swallower output and to provide a ramping output upon receiving the pulse swallower output and a compare circuit configured to receive the input timing data and the ramping output and to provide output data when the ramping output equals the input timing data, provides an interpolator circuit which generates precisely timed output data based upon the input timing data.

In preferred embodiments the input timing data has one kind of logic level and the output data has another kind of logic level and the interpolator circuit includes a calibration circuit which provides an output which can be used in determining whether the interpolator circuit is operating properly.

It has also been discovered that providing a circuit for producing period information, the circuit including a plurality of period oscillators, each of the oscillators including a memory, a summation circuit, and an edge selector circuit, each memory receiving period addresses and producing corresponding period values, each summation circuit receiving a period value from the memory of the oscillator in which it is located and at least one other period value from a memory of another of the oscillators, each edge selector circuit producing a signal that identifies an edge of a reference clock signal located an integral number of edges away from a previously identified edge, the integral number being determined from the most significant portion of the summation output, provides a period oscillator circuit that can be used in conjunction with a high-speed automatic test system having multiple, lower-speed, parallel data paths, the period oscillator circuit not requiring the incorporation of expensive, high-speed, custom-manufactured integrated circuits.

In preferred embodiments, the period oscillator circuit consists of two oscillators. Each edge selector circuit includes a counter arranged to receive the most significant portion of the summation output, to count a corresponding number of clock cycles, and, upon counting the number of clock cycles, to produce the signal that identifies a clock edge. Each oscillator includes a residue circuit that produces a residue signal representative of a residual time from the clock edge identified by the counter, the residual time being determined from a summation of a least significant portion of the summation output and a previous residue signal. Each oscillator includes a pipeline-to-pipeline synchronizer that receives period values, and that outputs the period values on a first-in-first-out basis to the summation circuit at times determined by clock edges selected by the oscillator's own counter, the pipeline-to-pipeline synchronizer receiving the period values at times determined by clock edges selected by a counter of another oscillator.

It has also been discovered that providing a timing circuit including a timing generator and a formatter, the timing generator receiving a period signal that identifies reference points in time that the timing generator uses to time the performance of certain actions and a data signal characterizing the nature of the actions, the timing generator selecting either a first calibration value representing an amount of time delay from the reference points needed to compensate for timing skew characteristic of a first action, or a second calibration value representing an amount of time delay needed to compensate for skew characteristic of a second action, the timing generator basing the selection on the value of the data signal and producing a timing generator output that identifies points in time corresponding to the reference points but delayed by the selected calibration value, the formatter receiving the timing generator output and performing the actions at the points in time identified in the timing generator output, provides a circuit in which the timing generator can conveniently and readily determine which calibration value to use.

In preferred embodiments, the period signal includes an edge selection signal that identifies an edge of a clock signal, and a residue signal representative of a residual time from the identified clock edge. The timing generator receives a timing signal representative of a time delay from the reference points identified by the period signal. The timing generator digitally adds the calibration value to the timing value and the residue value. The points in time identified by the timing generator output are delayed from the reference points not only by the calibration time delay but also by the time delay represented by the timing signal.

DESCRIPTION OF THE PREFERRED EMBODIMENT

The attached drawings illustrate the preferred embodiment, the structure and operation of which is then described.

DRAWINGS

Figure 3:
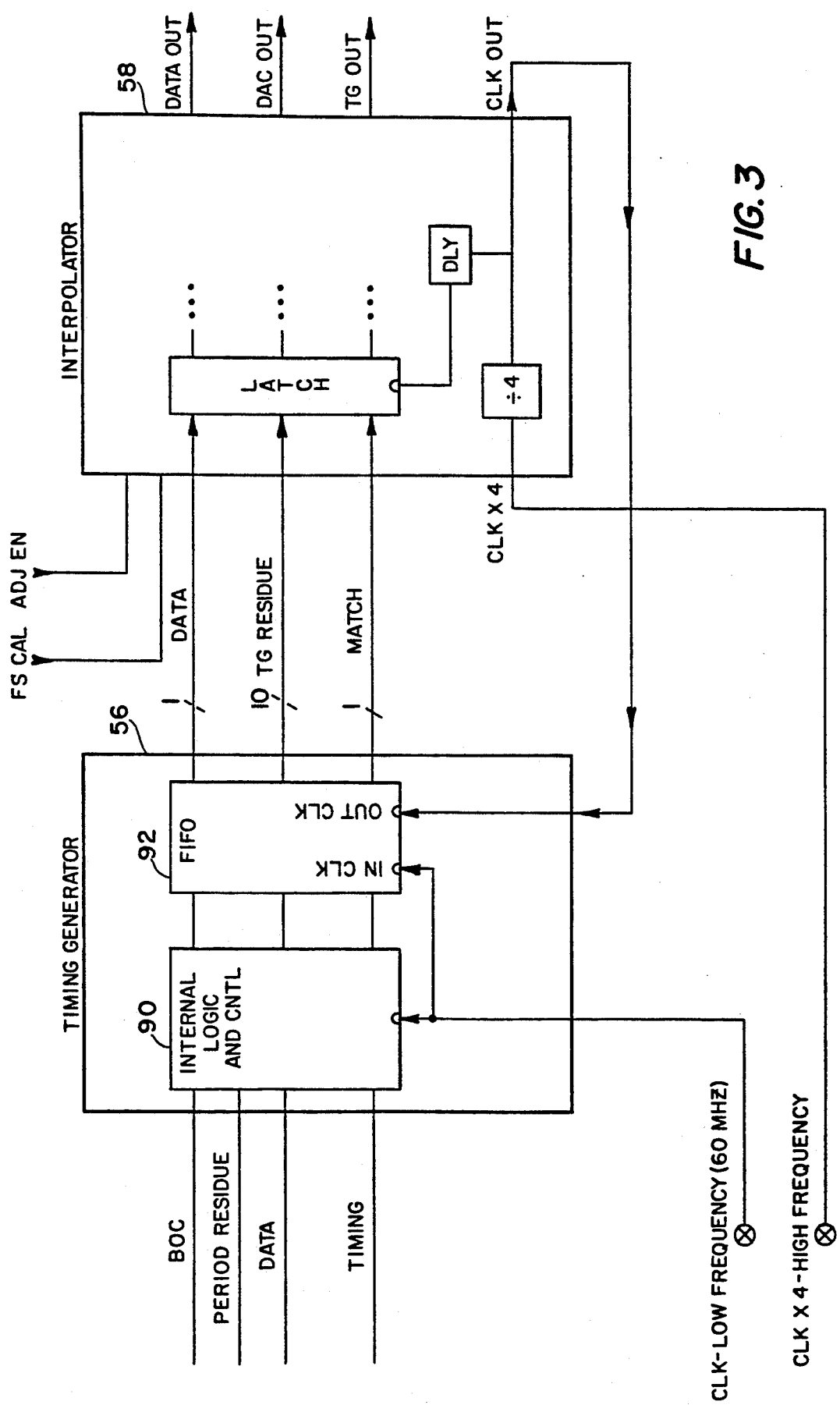
FIG. 3 is a block diagram of timing generator and interpolator circuits of the FIG. 1 timing generator.
Figure 4:
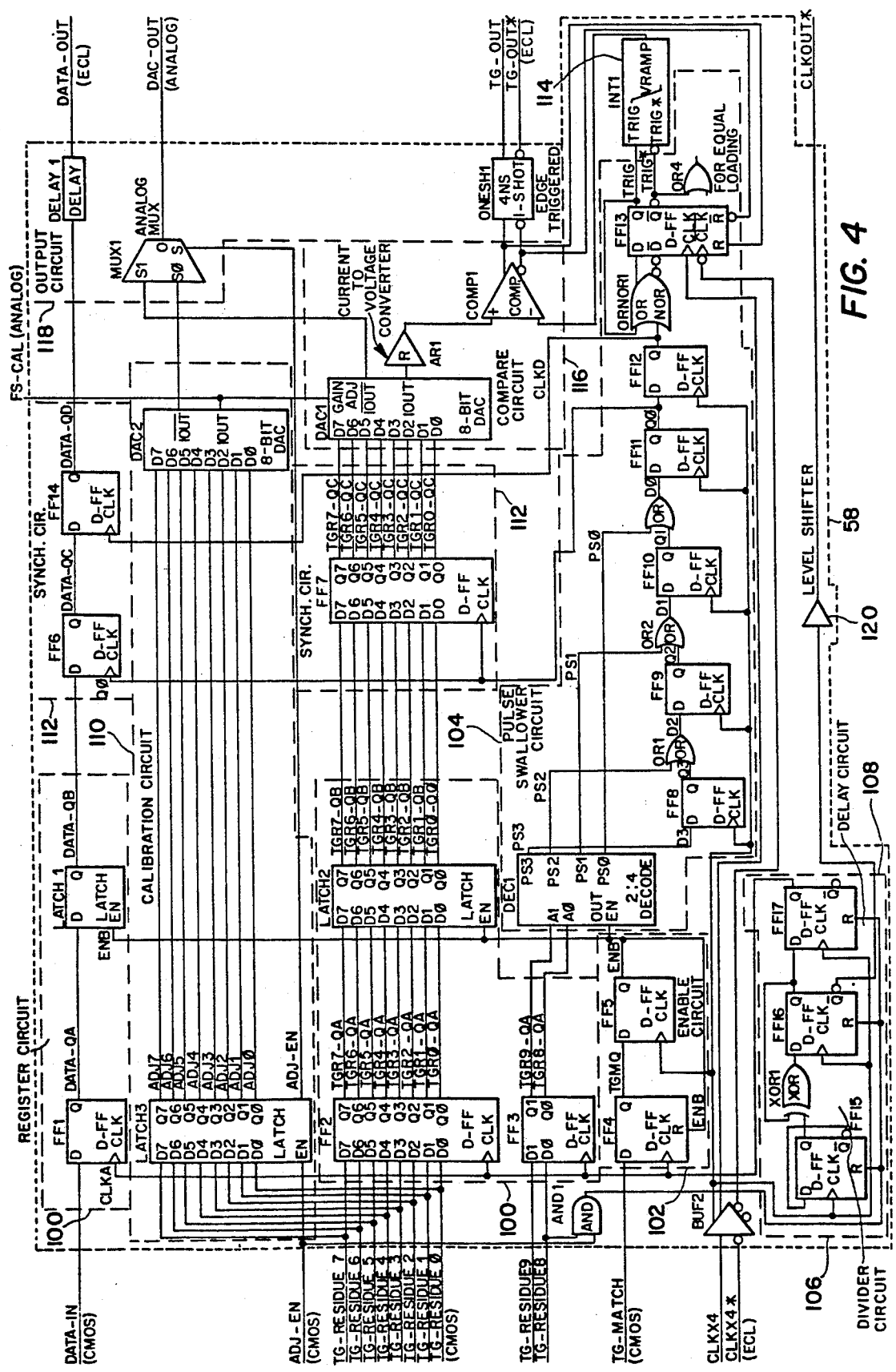

FIG. 4 s a schematic diagram of the FIG. 3 interpolator circuit.

Figure 5:
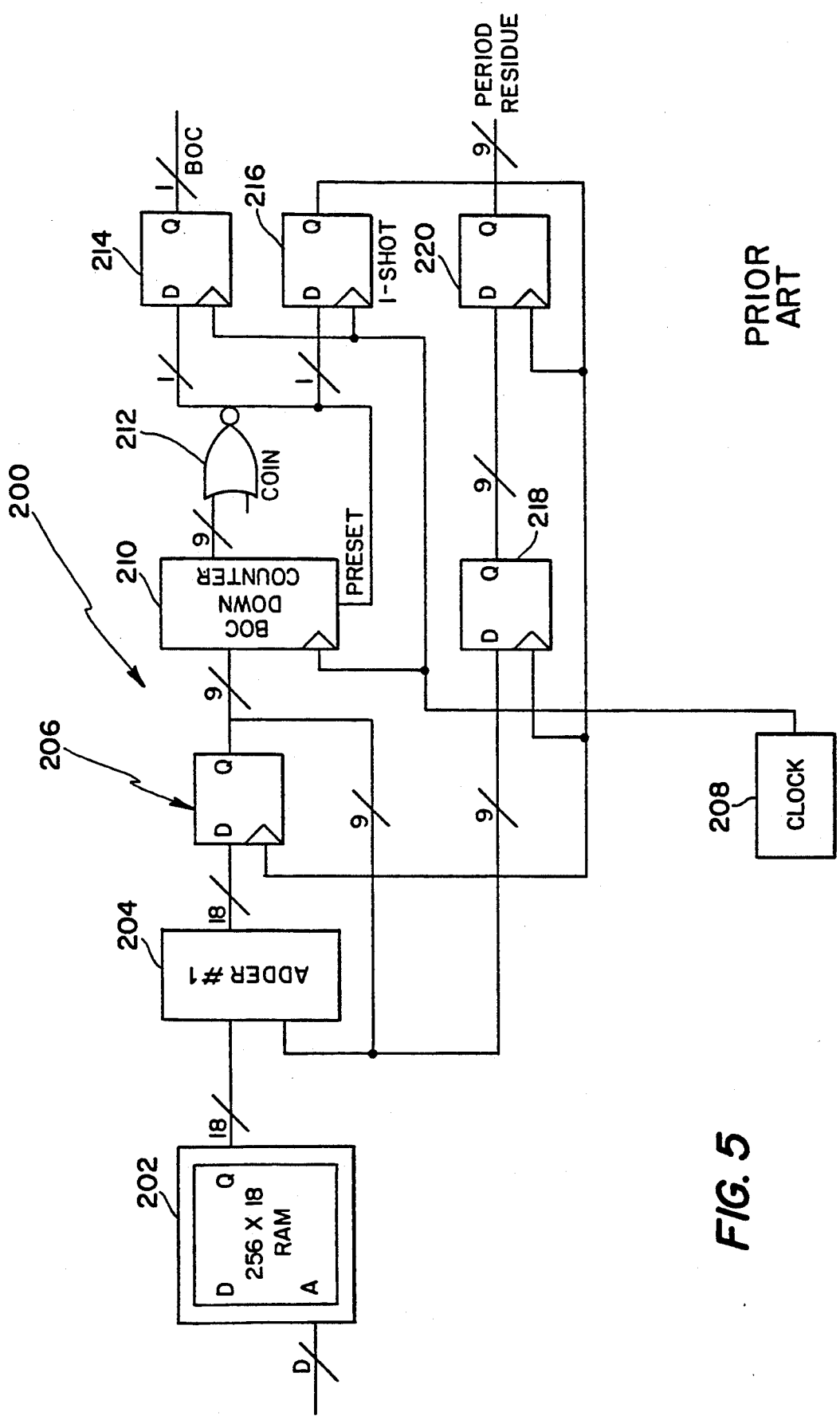

FIG. 5 is a block diagram of a known period oscillator circuit.

Figure 6:
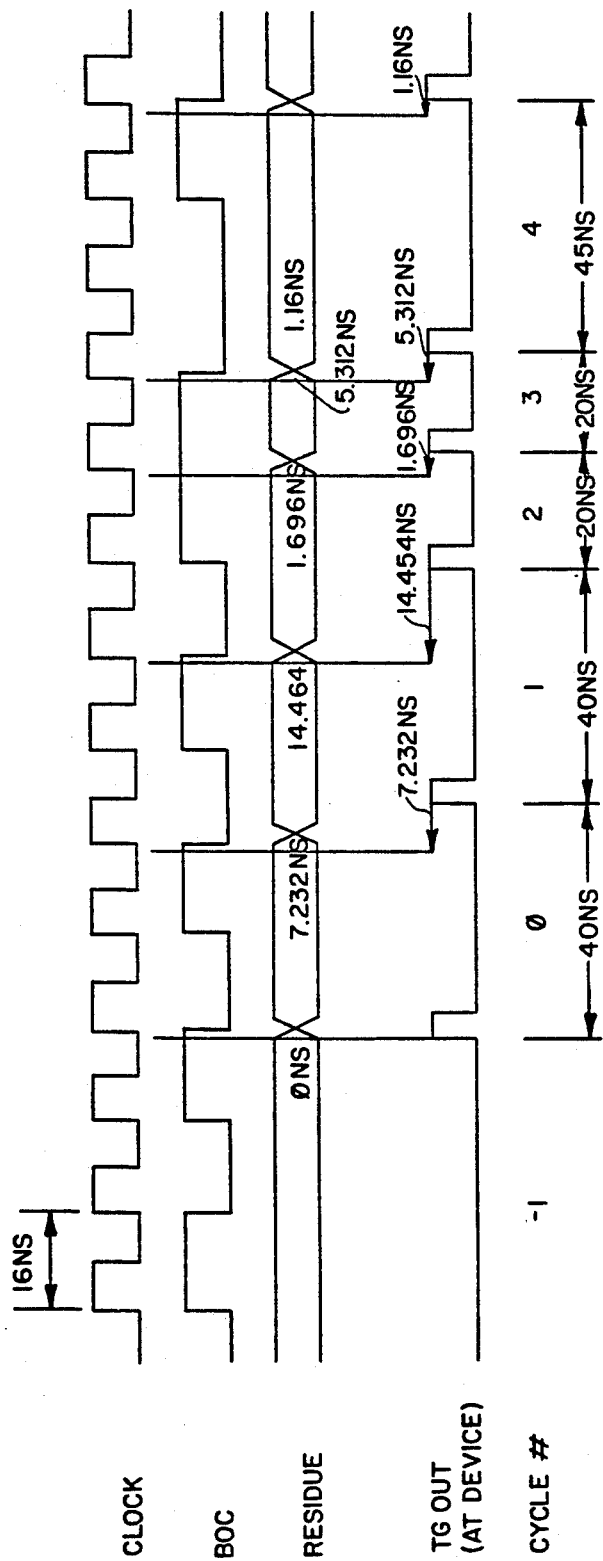

FIG. 6 is a timing diagram for the FIG. 5 period oscillator circuit.

Figure 1:
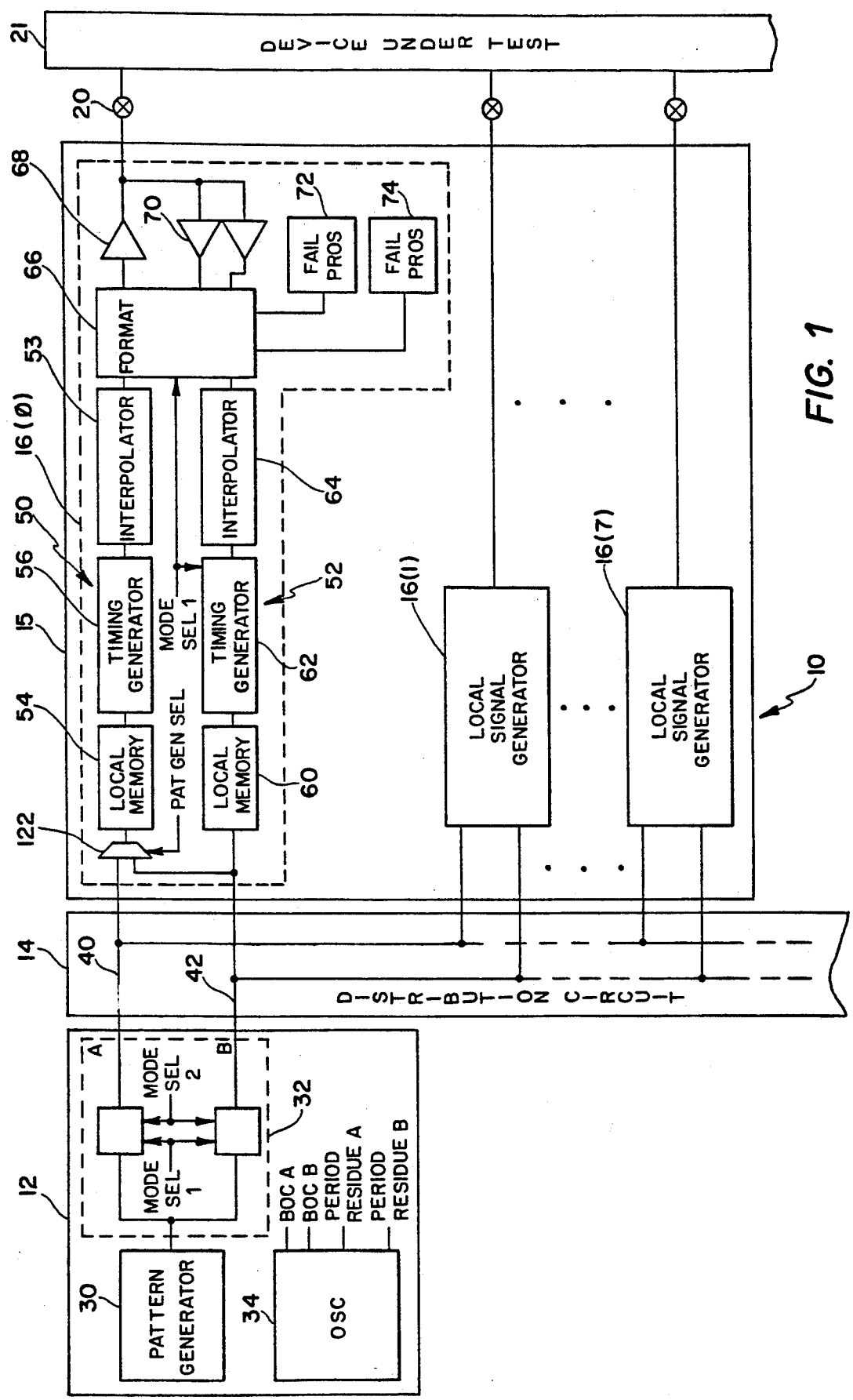
FIG. 1 is a schematic block diagram of a high speed timing generator according to the invention.
Figure 7:
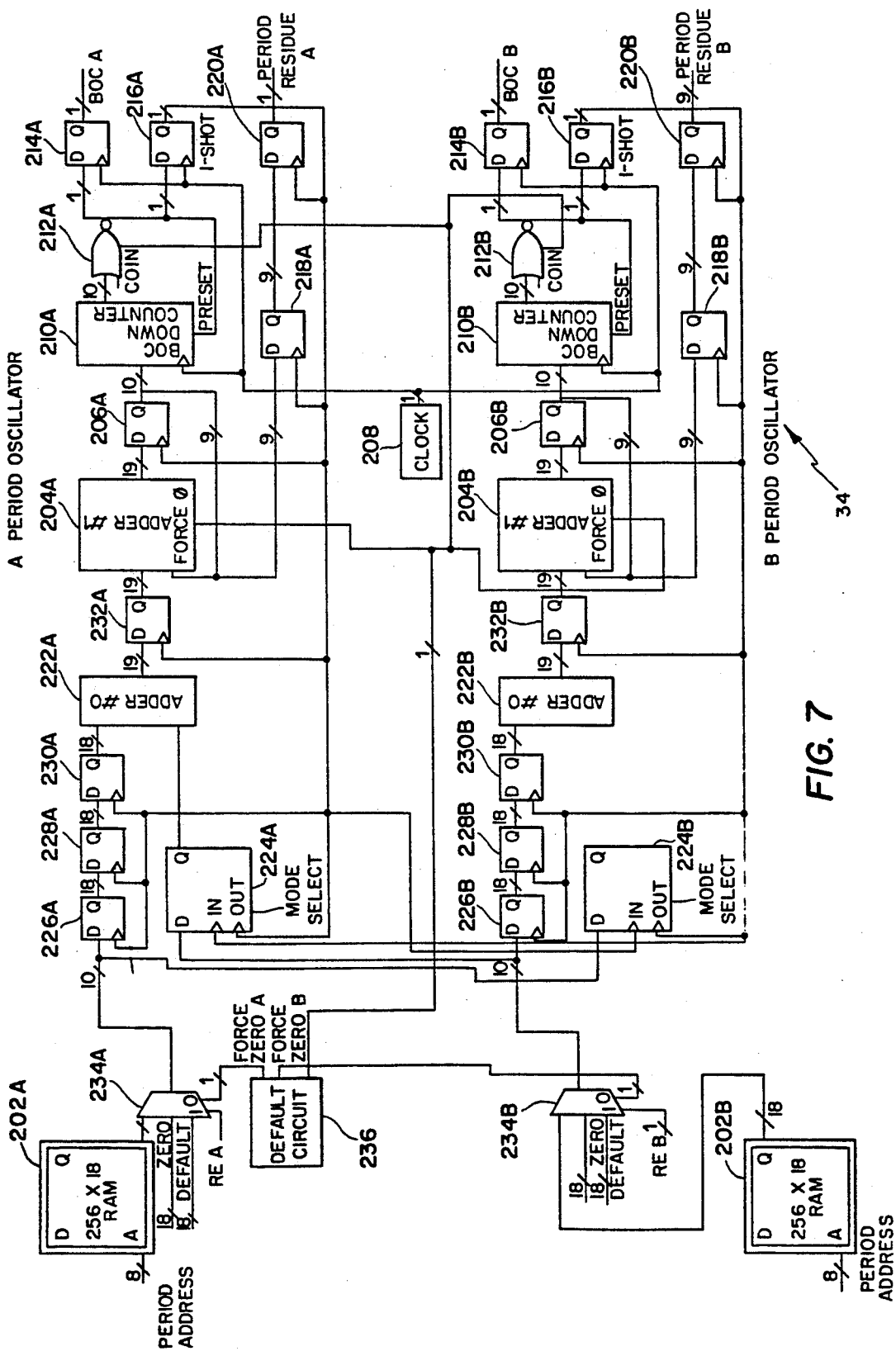

FIG. 7 is a block diagram of the period oscillator circuit of the FIG. 1 timing generator.

Figure 8:
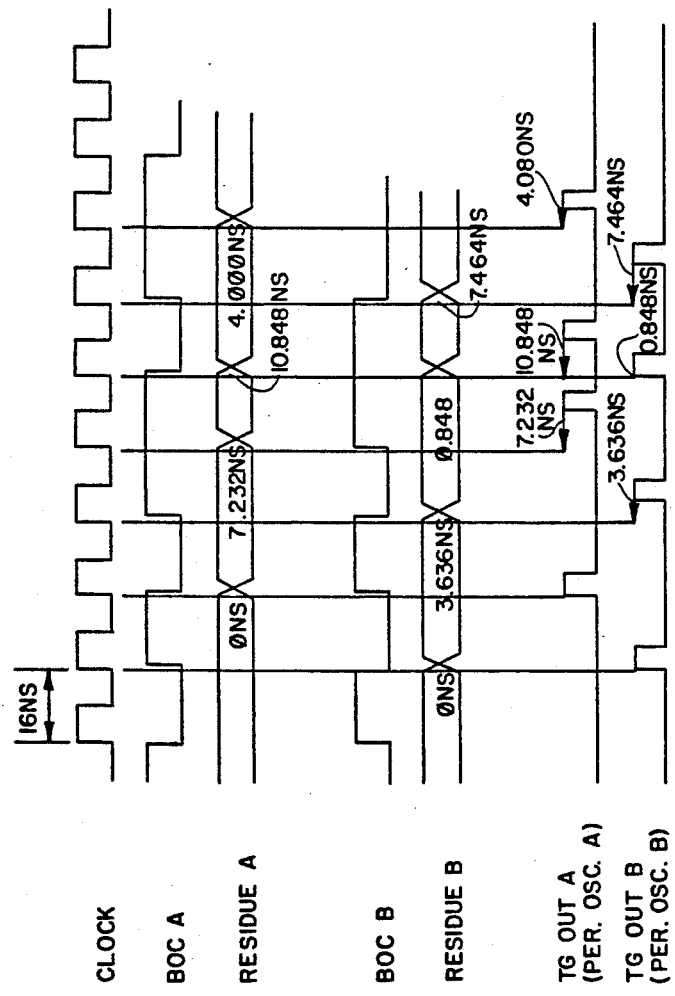

FIG. 8 is a timing diagram for the FIG. 7 period oscillator circuit.

STRUCTURE

Referring to FIG. 1, high speed timing generator system 10 includes pattern generator circuit 12, distribution circuit 14 and a plurality of channel cards 15, each including eight local generator circuits 16(0)–16(7) (which are generally referred to by reference numeral 16). Each local generator circuit 16 provides a bit at node input to device under test (DUT) 21.

Pattern generator circuit 12 includes conventionally designed high speed pattern generator 30 which provides address patterns at a frequency of 122.0703125 MHz (generally referred to as 120 MHz) and frequency divider circuit 32 which receives the high frequency patterns generated by pattern generator 30 and provides a pair of lower frequency address patterns, at outputs labelled A and B, which are half the frequency (i.e., 61.03515625 MHz, generally referred to as 60 MHz) of the high frequency address patterns generated by pattern generator 30. Pattern generator circuit 12 also includes a central period oscillator 34 which provides a pair of beginning of cycle (BOC) signals and a pair of multi-bit PERIOD RESIDUE signals to local generator circuits 16 via distribution circuit 14.

Frequency divider circuit 32 is controlled by two mode select inputs, MODE SEL 1 and MODE SEL 2. MODE SEL 1 can be set to a first value to cause divider circuit 32 to divide the address patterns into two differing patterns as described above, or to a second value to cause divider circuit 32 simply to produce at both outputs A and B the same frequency patterns generated by pattern generator 30. When MODE SEL 1 is set to the first value, pattern generator circuit 12 can be used in conjunction with channel cards 15 having dual-path local generator circuits 16 as shown in FIG. 1. When MODE SEL 1 is set to the second value, the same pattern generator circuit 12 can be used, as part of a lower-speed system, in conjunction with less costly channel cards that have only single-path local generator circuits connected to the A output of divider circuit 32.

MODE SEL 2 can be set to a first value, to cause divider circuit 32 to receive a single high-speed input from a single pattern generator 30 as shown in FIG. 1, or to a second value, to cause divider circuit 32 to receive two separate lower-speed inputs over two separate paths provided by two lower-speed pattern generators (not shown in FIG. 1 for the sake of simplicity). When MODE SEL 2 is set to this second value, MODE SEL 1 must also be set to its second value, thereby causing divider circuit 32 to produce at outputs A and B, without any division of the address patterns, the two respective signals received from the two pattern generators. When MODE SEL 2 is set to its second value, timing generator system 10 provides, at each node input 20 of device under test 21, a waveform having characteristics determined by either the signals provided over the A path or the signals provided over the B path, as selected by a pattern generator select input (PAT GEN SEL) that is applied to each local generator circuit 16 on a given channel card 15.

Distribution circuit 14 includes a pair of signal distribution paths 40, 42. Each signal distribution path 40, 42 includes a parallel-multibit bus which simultaneously provides the lower frequency addresses, as well as the BOC signals and the PERIOD RESIDUE signals, to the plurality of ocal generator circuits 16.

Each local signal generator 16 includes a pair of signal generating circuits 50, 52. Signal generating circuit 50 includes local memory 54, which receives information from distribution path 40 through multiplexer 122 and provides information to timing generator 56, and timing generator 56, which receives the information and provides a timing generator output to interpolator circuit 58. Likewise, signal generating circuit 52 includes local memory 60, which receives information from distribution path 42, timing generator 62 which receives information from local memory 60, and interpolator circuit 64, which receives information from timing generator 62. Although, for purposes of simplicity, only one timing generator and one interpolator are shown in each signal generating circuit, there are typically several timing generators and interpolators, and in a preferred embodiment there are six timing generators and interpolators in each signal generating circuit.

Interpolator circuits 58 and 64 provide signals to high speed formatter 66. Formatter 66 is a conventional emitter coupled logic (ECL) high speed formatter which receives timing pulses and data and provides a waveform indicating high or low at a particular time as well as a waveform indicating a drive or tristate condition at a particular time. Driver 68 receives the signal indicating high or low, compensates for any tri-state conditions, and provides an output to node 20, the output having the correct voltage levels for the particular device under test (DUT).

Dual detector 70 is also connected to node 20; dual detector 70 provides an output to high speed formatter 66. Dual detector 70 includes a comparator that compares a signal received from the device under test (DUT) with a high value, and a comparator that compares the signal with a low value. High speed formatter 66 is also connected to a pair of fail processors 72, 74.

Multiplexer 122 receives information from both distribution paths 40 and 42, and outputs information from one path or another based on the state of the PAT GEN SEL input, which is applied to each multiplexer 122 of each of the local generators 16 on a given channel card 15. Differing PAT GEN SEL inputs are applied to differing channel cards. PAT GEN SEL is used in conjunction with the MODE SEL 2 input to divider circuit 32, which causes divider circuit 32 to receive address patterns from two pattern generators, and with MODE SEL 1, which causes divider circuit 32 to output, without any division, address patterns from one pattern generator over distribution path 40 and address patterns from another pattern generator over distribution path 42. MODE SEL 1 prevents timing generator 62 from outputting any timing pulses, and causes formatter 66 to ignore any information received from signal generating circuit 52. Thus, PAT GEN SEL, in conjunction with MODE SEL 1 and MODE SEL 2, selects whether a given channel card 15 will output waveforms having characteristics determined by information provided over distribution path 40, or by information provided over distribution path 42.

Figure 2:
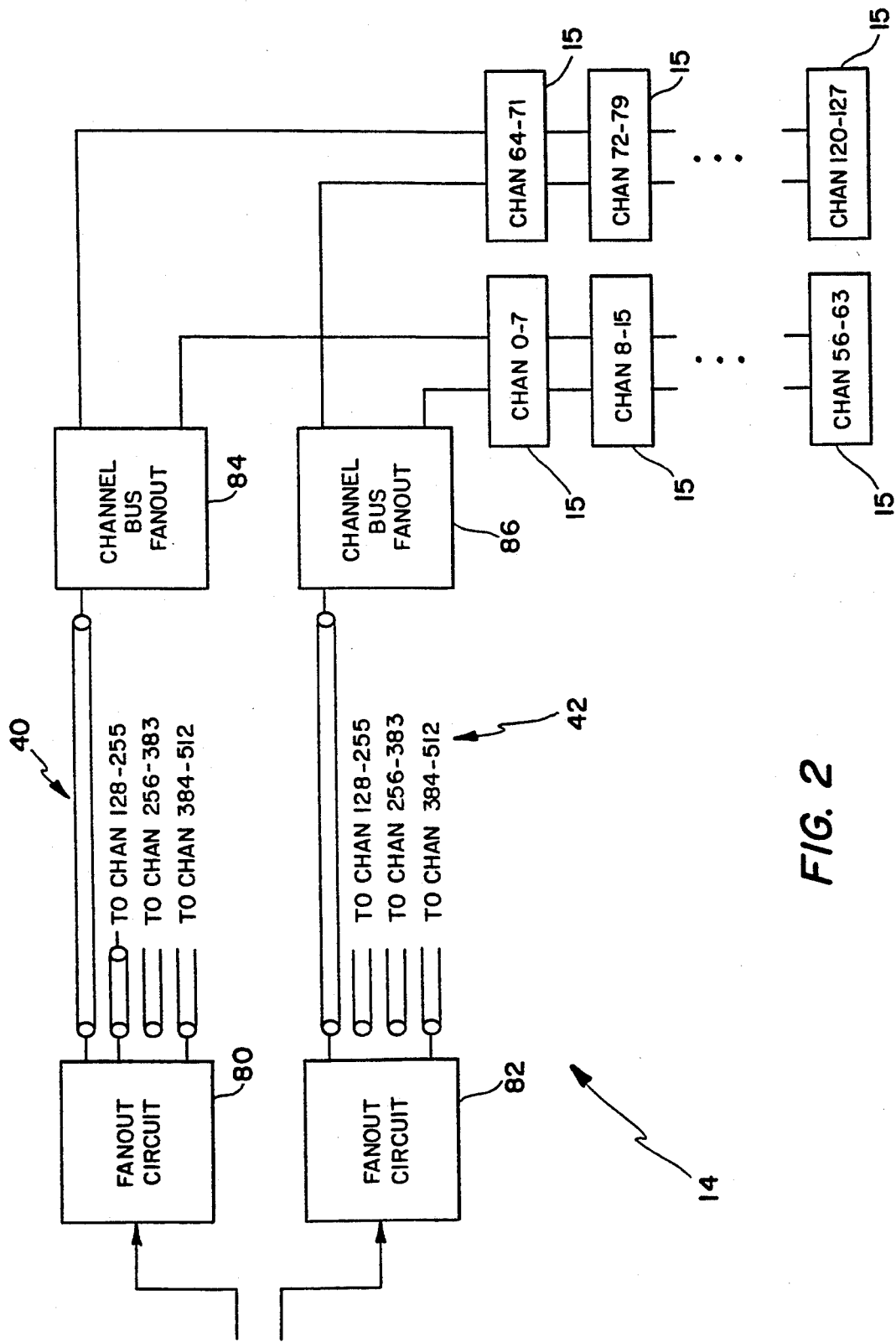
FIG. 2 is a block diagram of a distribution circuit of the FIG. 1 timing generator.

Referring to FIG. 2, each distribution path 40, 42 of distribution circuit 14 includes two address/timing fanout circuits 80, 82 which each provide four parallel paths. Each parallel path of path 40 is connected to channel bus fanout circuit 84 via a transmission line assembly cable. Each paralleled path of path 42 is connected to channel bus fanout circuit 86 via a transmission line assembly cable. Accordingly, there are eight channel bus fanout circuits in all. Each pair of channel bus fanout circuits 84, 86 is connected to 16 channel cards via backplane traces. Each channel card 15 contains eight channels, each channel including a local generator circuit 16. Accordingly, a distribution circuit 14 distributes signals to 512 local generator circuits, thus, system 10 provides 512 connections to a DUT.

Referring to FIG. 3, the interconnection between timing generator 56 and interpolator circuit 58 is shown. Timing generator 56 includes internal control logic 90 which is clocked by a low frequency (60 MHz) CMOS level CLK signal and first in, first out (FIFO) circuit 92, the input of which is clocked by CLK and the output of which is clocked by a low frequency CLKOUT signal. CLKOUT is generated by interpolator circuit 58. FIFO circuit 92 receives DATA, TG RESIDUE and MATCH inputs from control logic 90 and provides DATA, TG RESIDUE and MATCH outputs as the outputs of timing generator 56. Note that TG RESIDUE is a signal that is distinct from the PERIOD RESIDUE signals. Interpolator circuit 58 is clocked by a high frequency (240 MHz) CLKx4 signal; interpolator circuit 58 receives the 1-bit DATA signal, the 10-bit TG RESIDUE signal and the 1-bit MATCH signal from timing generator 56 as well as an analog interpolator calibration input (FS CAL) that is generated externally and an adjust enable input (ADJ EN). Interpolator circuit 58 uses the CMOS level DATA, TG RESIDUE and MATCH signals to provide a precisely delayed ECL pulse out (TG OUT), a bit of digital data (DATA OUT) which is delayed approximately the same amount as the precisely timed pulse out and has ECL levels and an analog test output (DAC OUT).

Referring to FIG. 4, interpolator circuit 58 is fabricated as a bi-polar integrated circuit and includes register circuit 100, enable circuit 102, pulse swallower circuit 104, divider circuit 106, delay circuit 108, calibration circuit 110, synchronizing circuit 112, ramping circuit 114, compare circuit 116 and output circuit 118.

Register circuit 100 includes flip flop FF1, which receives the CMOS level DATA IN signal from timing generator 56 and provides an ECL level DATA QA signal to LATCH 1, flip flop FF2, which receives eight bits of the CMOS level TG RESIDUE signal (Bits 0-7) from timing generator 56 and provides a eight bit ECL level TGR QA signal to LATCH 2, and flip flop FF3, which receives the remaining two bits of the TG RESIDUE signal (bits 8,9) from timing generator 56 and applies a two bit TGR QA signal to pulse swallower 104.

Enable circuit 102 includes flip flops FF4 and FF5. FF4 receives the CMOS level TG MATCH input and provides an ECL level TGMQ signal to FF5 which provides the enable (ENB) signal.

Pulse swallower circuit 104 includes 2:4 decoder (DEC1) which receives the two bit TGR QA signal from FF3 of register circuit 100 and the ENB signal from FF5 of enable circuit 102. DEC1 provides four output signals (PSO, PS1, PS2 and PS3). PS3 is provided to D flip-flop FF8, the output of which, Q3, is provided to OR gate OR1. OR1 also receives the PS2 signal and provides an input, D2, to D flip-flop FF9, the output of which is provided to OR gate OR2. OR2 also receives the PSI signal and provides an input, D1, to D flip-flop FF10, the output of which is provided to OR gate OR3. OR3 also receives the PSO signal and provides an input, DO, to D flip-flop FF11. FF11 provides an input to D flip-flop FF12 as well as to the clock input of flip-flop FF6 and flip flop FF7 of synchronizing circuit 112. The output of FF12 is provided to differential ORNOR gate ORNOR1 as well as to the clock input of flip-flop FF14 of synchronizing circuit 112.

ORNOR1 provides an active high signal and an active low signal to fully differential D flip-flop FF13. FF13 provides differential signals TRIG and TRIG* to ramping circuit 114. The TRIG signal is also provided as the other input of ORNOR1 and, for equal loading, the TRIG* signal is provided as an input to OR4. The output of ramping circuit 114 is connected to the negative input to comparator COMP1 of compare circuit 116.

Divider circuit 106 includes flip-flops FF15 and FF16 and exclusive-OR gate XOR1. FF15 and FF16 are configured as D flip-flops and are clocked by CLKX4 which is buffered by buffer BUF2. The Q output of FF15 is provided to XOR1, to which the Q output of FF16 is also provided. The Q' output of FF16 is shifted by level shifter 120 to provide the CLKOUT* signal which is fed back to timing generator 56. The Q output of FF16 is fed throuqh flip-flop FF17 of delay circuit 108 to provide the clock CLKA for flip-flops FF1-4 of register circuit 100.

Calibration circuit 110 includes LATCH 3, which receives the eight bit TG RESIDUE 0-7 input and the adjust enable (ADJ EN) input and provides an eight bit ADJ output signal to 8-bit digital-to-analog converter DAC2, which provides an analog FS CAL output. FS CAL is an output of interpolator circuit 58 and is also provided to the GAINADJ input of DAC1. DAC2 also provides a complement output IOUT1), which is connected to 2 to 1 analog multiplexer MUX1.

Synchronizing circuit 112 includes D flip-flop FF6, which receives the DATA QB signal from LATCH1, and D flip-flop FF7, which receives the eight bit TGR QB signal from LATCH 2. FF6 provides a DATA QC input to D flip flop FF14 which provides a DATA QD output signal. FF7 provides an eight bit TGR QC output signal to compare circuit 116.

Compare circuit 116 includes 8-bit digital-to-analog converter (DAC1) which receives the eight bit TGR QC output from FF7 of synchronizing circuit 112. DAC1 provides a current output (IOUT) to current-to-voltage converter AR1 and a complement current output (IOUT*) to 2-to-1 analog multiplexer MUX1. IOUT is connected to the positive input of COMP1. COMP1 provides a differential output signal which is provided to one-shot ONESH1 of output circuit 118 and to the reset input of FF13.

Output circuit 118 includes MUX1, which provides the analog DAC OUT signal, delay line DELAY1, which provides the ECL DATA OUT signal, and ONESH1 which provides the differential, ECL TG OUT and TG OUT* signals.

Before describing the period oscillator circuit shown in the timing generator circuit of FIG. 1, it will be helpful first to describe a known period oscillator circuit designed for use in a timing generator system without multiple, parallel data paths. Referring to FIG. 5, in period oscillator circuit 200, 256-times 18 bit random access memory 202 receives an 8-bit period address and produces an 18-bit period value. Adder 204 receives the 18-bit period value as one input, and receives as another input the nine least significant bits of the output of register 206, which receives the output of adder 204. The nine most significant bits of the output of register 206, which have a resolution of 16.384 nanoseconds (the period of clock 208), represent a digital part of the period value. The nine least significant bits of the output of register 206, which have a resolution of 32 picoseconds (16,384 picoseconds / $2^9$), represent an analog part of the period value.

Beginning-of-cycle down counter 210 receives the nine most significant bits of the output of register 206 and produces a nine-bit output that counts down the number of upward edges of clock 208 specified by the nine input bits. Coincidence detector 212 receives the output of beginning-of-cycle down counter 210 and produces an output that is high only when the output of beginning-of-cycle down counter 210 is one or zero. The output of coincidence detector 212 is received as the preset input to beginning-of-cycle down counter 210. The beginning-of-cycle down counter loads the nine input bits from register 206 whenever the output of clock 208 goes high while the preset input is high, and the output counts down the upward edges of clock 208.

The output of coincidence detector 212 is received by flip-flop 214, which is clocked by upward edges of clock 208 and which produces as an output a beginning-of-cycle (BOC) signal. The output of coincidence detector 212 is received by one-shot 216, which is clocked by the output of clock 208. The output of one-shot 216 goes high whenever the output of clock 208 goes high while the output of coincidence detector 212 is high. The output of one-shot 216 remains high for approximately 8 nanoseconds (half of the period of clock 208). The output of one-shot 216 clocks register 206, register 218, which receives the nine least significant bits of the output of register 206, and register 220, which receives the output of register 218 and which produces as an output a PERIOD RESIDUE signal. The output of one-shot 216 also clocks a pattern generator that produces the 8-bit period addresses received by random access memory 202.

Referring to FIG. 6, BOC indicates which upward edge of the clock is to be used as a reference mark for the beginning of a cycle for the device under test (DUT). The vertical lines through the timing diagram represent the selected clock edges. A cycle begins at each upward edge of the clock that occurs while BOC is high, the cycle being delayed by a residual amount of time represented by the PERIOD RESIDUE signal. A timing generator receives both BOC and PERIOD RESIDUE and an interpolation circuit connected to the timing generator produces as an output the signal TG OUT, which for purposes of simplicity is shown going high at the beginning of each cycle. The point in time at which TG OUT goes high may actually be delayed by an amount of time programmed into the timing generator, the amount of time varying with each cycle. In an alternative embodiment, each of a pair of timing generators may receive both BOC and PERIOD RESIDUE and operate in an interleaved fashion, each of the timing generators being connected to one of a pair of interpolation circuits, with one interpolation circuit generating all even cycle information and another interpolation circuit generating all odd cycle information. The cycle boundaries of the waveform applied to the device under test (DUT) can be programmed to the 32 picoseconds resolution of the PERIOD RESIDUE signal. Note that before each burst begins, the period oscillator executes default periods of 32.768 nanoseconds (two clock periods). These default periods do not affect the device under test (DUT).

Referring to FIG. 7, in which components analogous to those in FIG. 5 are labelled as in FIG. 5 with suffixes A and B, oscillator 34 according to the invention is designed for use in conjunction with the high-speed timing generator system of FIG. 1, which has multiple, lower-speed parallel data paths. Oscillator 34 does not require the use of expensive, high-speed, custom-manufactured integrated circuits, because the oscillator itself is divided into two lower-speed period oscillators A and B. Period oscillator A produces a BOC A and a PERIOD RESIDUE A signal for cycles 0, 2, 4, 6, etc. of each burst of period data, while period oscillator B produces a BOC B and a PERIOD RESIDUE B signal for cycles 1, 3, 5, 7, etc. of each burst. The BOC and PERIOD RESIDUE signals that define the beginning of cycle 2 are determined by the sum of the period value of cycles 0 and 1; the BOC and PERIOD RESIDUE signals that define the beginning of cycle 3 are determined by the sum of the period values of cycles 1 and 2; etc.

The period oscillators include random access memories 202A and 202B, which contain identical period value data. Random access memory 202A is addressed by period addresses provided by the A output of frequency divider circuit 32 (FIG. 1). Random access memory 202B is addressed by period addresses provided by the B output of frequency divider circuit 32.

An adder 222A or 222B within each oscillator must receive a period value from the oscillator's own random access memory and must receive from the random access memory of the other oscillator the next period value in the series of period values in the burst being executed. Note, however, that period oscillators A and B are clocked by differing clock signals from one-shots 216A and 216B respectively, and that these clock signals may sometimes occur simultaneously. Nevertheless, first-in-first-out pipeline-to-pipeline synchronizer circuits 224A and 224B, in conjunction with registers 226A, 228A, 230A, 226B, 228B, and 230B, ensure that the proper inputs are always present at adders 222A and 222B. Pipeline-to-pipeline synchronizer circuit 224B clocks in period values when the output of one-shot 216A goes high and clocks out period values when the output of one-shot 216B goes high immediately after the next occurrence of one-shot 216A going high. In some instances pipeline-to-pipeline synchronizer 224B may clock out period values when the output of one-shot 216B goes high simultaneously with the next occurrence of one-shot 216A going high, as long as the period value is clocked out three cycles after it is clocked in. In effect, therefore, pipeline-to-pipeline synchronizer 224B delays the period value from period oscillator A by one cycle less than the amount of time by which registers 226B, 228B, and 230B delay the period value from period oscillator B.

Likewise, pipeline-to-pipeline synchronizer circuit 224A clocks in period values when the output of one-shot 216B goes high and clocks out period values when the output of one-shot 216A goes high immediately after the next occurrence of one-shot 216B going high. In some instances pipeline-to-pipeline synchronizer 224A may clock out period values when the output of one-shot 216A goes high simultaneously with the next occurrence of one-shot 216B going high, as long as the period value is clocked out three cycles after it is clocked in. Pipeline-to-pipeline synchronizer circuits 224A and 224B enable oscillators A and B to calculate sums on the fly, without requiring the sums to be pre-stored in random access memories 202A and 202B. Consequently, oscillator 34 can be employed in automatic test systems in which the pattern sequence, and hence the period value sequence, can vary due to the response of the device under test (DUT).

Pipeline-to-pipeline synchronizer circuits 224A and 24B receive a mode selection input that can be used to force the values at the outputs of the pipeline-to-pipeline synchronizers to zero, in order to permit period oscillators A and B to operate as two independent oscillators. Each of period oscillators A and B, when operating as an independent oscillator, operates at a maximum frequency that is half the maximum frequency of operation of the entire oscillator circuit when it operates as a single oscillator. The mode selection input is used in conjunction with the MODE SEL 1 input to divider circuit 32 (FIG. 1) to permit the pattern generator circuit 12 (FIG. 1) to be used in conjunction with channel cards having only single-path local generator circuits connected to the A output of divider circuit 32 and to the BOC A and RESIDUE A outputs of oscillator circuit 34. Alternatively, the mode selection input is used in conjunction with the MODE SEL 2 input to divider circuit 32 to permit the entire high-speed timing generator system to operate with two pattern generators and to provide, at each node input of the device under test, a waveform resulting from either the signals provided over the A path or the signals provided over the B path, as determined by pattern generator select inputs to each local generator.

Register 232A is provided between adders 222A and 204A, and register 232B is provided between adders 222B and 204B. These registers permit the use of adders that operate at half the speed that would be required if the registers were not present.

Multiplexers 234A and 234B receive period values provided by random access memories 202A and 202B, and receive period values of zero and default period values of 16.384 nanoseconds (one clock cycle). Multiplexers 234A and 234B are addressed by rank enable signals RE A and RE B from the pattern generator and by FORCE ZERO A and FORCE ZERO B from default circuit 236. The outputs of multiplexers 234A and 234B are connected to registers 226A and 226B respectively, and to pipeline-to-pipeline synchronizer circuits 224B and 224A respectively. Default circuit 236 also provides an input to adders 204A and 204B that forces the outputs of the adders to zero and an input to coincidence detectors 212A and 212B that forces the outputs of the Coincidence detectors high. Before each burst of period values during the operation of the automatic test system, default circuit 236 resets and synchronizes oscillators A and B through multiplexers 234A and 234B in a manner described below.

The remaining components of oscillators A and B are analogous to the components shown in the circuitry of FIG. 5.

Referring to FIG. 8, BOC A and BOC B indicate which upward edges of the clock are to be used to as a reference mark for the beginning of even and odd cycles, respectively, for the device under test (DUT). Note that the clock signal that serves as a reference mark for the beginning of cycle 3 also serves as a reference mark for the beginning of cycle 4. Within a given local generator circuit 16 (FIG. 1), one timing generator receives both BOC A and PERIOD RESIDUE A, and an associated interpolation circuit produces as an output the signal TG OUT A, which is shown for simplicity going high at the beginning of each A cycle. Another timing generator receives both BOC B and PERIOD RESIDUE B, and an associated interpolation circuit produces as an output the signal TG OUT B. The waveform applied to the device under test (DUT) depends upon the points in time at which either TG OUT A or TG OUT B goes high. Note that before each burst begins, each of period oscillators executes default periods of 32.768 nanoseconds (two clock periods). Consequently, the oscillator circuit as a whole executes default periods of 16.384 nanoseconds. These default periods do not affect the device under test (DUT).

OPERATION

Referring to FIG. 1, pattern generator 30 generates address patterns at a frequency of 120 MHz. This information is provided to frequency divider circuit 32 which receives the 120 MHz address pattern and provides two half speed (i.e., 60 MHz) address patterns to signal distribution paths, 40, 42, respectively of distribution circuit 141. The half speed address patterns are cyclically, alternately provided to signal distribution paths 40, 42 by divider circuit 32, thus, divider circuit 32 functions as an alternator. Because the pattern is frequency divided prior to transmission to local generators 16, signal distribution paths, 40, 42 need only be appropriate for transmitting signals having a frequency of 60 MHz rather than equals having a frequency of 120 MHz.

High speed timing generator 10 actually provides a 100 MHz signal at node 20; pattern generator 30 provides a 120 MHz signal to compensate for dead time of interpolator circuits 58, 64 (i.e., the amount of time taken by interpolator circuit 58 to provide a new edge) plus rising and falling calibration values. Interpolator circuits 58, 64 can refire every 16.384 ns; accordingly, generator 10 allows for a maximum difference of 3.616 ns between rising and falling calibration values in a 100 MHz generator 10.

At power-up and immediately before the start of each pattern burst, system 10 is resynchronized. More specifically, frequency divider circuit 32 is configured so that at power up, as well as when it is resynchronized, the first signal provided by frequency divider circuit 32 is provided at the output labelled A, and is sent over signal path 40. For a particular DUT, there may be between 10 to 200 pattern bursts for which system 10 is resynchronized. The period oscillator circuit 34 is resynchronized, in a manner described below, at the same time that the rest of the system is resynchronized.

Distribution circuit 14 provides the two half speed address patterns generated by divider circuit 32 to 512 channels. Each channel includes a local generator circuit 16 as shown in FIG. 1.

Referring to FIGS. 1 and 3, local memory 54 receives the half speed address pattern and, using look-up tables within memory 54, sends data to timing generator 56. This data includes a timing value (TIMING), and a data value (DATA). Timing generator 56 also receives one of the two beginning of cycle (BOC) signals and one of the two PERIOD RESIDUE signals from central period oscillator 34. Each timing generator, in internal logic and control 90, using BOC, PERIOD RESIDUE, TIMING, and DATA generates TG RESIDUE and MATCH signals to be sent to interpolator circuit 58. TG RESIDUE and MATCH are analogous to PERIOD RESIDUE and BOC, except that TG RESIDUE and MATCH define points in time that are delayed from the beginnings of cycles by amounts of time represented by the timing value (TIMING), and further delayed either by one of two calibration values. Internal logic and control 90 bases the selection of the calibration value on the value of DATA.

For a given timing generator, TG RESIDUE and MATCH represent either 1) the points in time at which formatter 66 is to place transitions in the waveform applied to the device under test (DUT), 2) the points in time at which formatter 66 indicates to driver 68 whether to begin or terminate applying the waveform to the device under test (DUT), 3) the points in time at which the outputs of dual detector 70 are latched, or 4) the points in time at which pin multiplexing is to occur. The value of DATA correspondingly represents either 1) whether a transition in the waveform will result in the waveform being high or the waveform being low, 2) whether formatter 66 is to indicate to driver 68 whether to begin or terminate applying the waveform to the device under test (DUT), or 3) whether a signal from the device under test (DUT) is expected to be high or low. In the fourth case, DATA is not used.

If DATA represents whether a transition in the waveform will result in the waveform being high or being low, then internal logic and control 90 of timing generator 56 must select between a "rising" calibration value corresponding to an amount of time needed to compensate for the skew in the waveform applied to the DUT that is due to a rising transition and a "falling" calibration value corresponding to an amount of time needed to compensate for the skew in the waveform that is due to a falling transition. Internal logic and control 90 selects either the "rising" calibration value or the "falling" calibration value by observing the data value (DATA). If DATA indicates that a transition in the waveform, if it occurs, will result in the wave form being at the high value, then it can be assumed that the transition will cause the skew due to a rising transition. Likewise, if DATA indicates that a transition in the waveform, if it occurs, will result in the waveform being at the low value, then it can be assumed that the transition will cause the skew due to a falling transition. Thus, by looking to the value of DATA, internal logic and control 90 can readily and conveniently determine which calibration value to use. Note that if the waveform is already at the high value (or the low value), and DATA indicates that a "transition" at a certain point in time will cause the waveform to remain at the high value (or the low value), then no transition in fact occurs. The calibration value is added digitally to the timing value and the period residue value by summation circuitry inside internal logic and control circuit 90, as is described in U.S Pat. application Ser. No. 07/012,815, entitled "Timing Generator," filed Feb. 9, 1987 by George William Conner, assigned to Teradyne, Inc., now abandoned and incorporated in its entirety herein.

Likewise, if DATA represents whether formatter 66 is to indicate to driver 68 whether to begin or terminate applying the waveform to the device under test (DUT), then internal logic and control 90 of timing generator 56 must select between an "on" calibration value corresponding to an amount of time needed to compensate for the skew in the waveform applied to the DUT that is due to formatter 66 beginning to apply the waveform to driver 68, or by an "off" calibration value corresponding to an amount of time needed to compensate for the skew in the waveform that is due to formatter 66 terminating application of the waveform to driver 68. If DATA represents whether a signal from the device under test (DUT) is expected to be high or low, then internal logic and control 90 of timing generator 56 must select between a "high" calibration value corresponding to an amount of time needed to compensate for the skew in the waveform that is caused by expecting the signal received from the device under test (DUT) to be high, and a "low" calibration value corresponding to an amount of time needed to compensate for the skew in the waveform that is caused by expecting the signal received from the device under test (DUT) to be low.

Register 92 is used to synchronize DATA, TG RESIDUE and MATCH with interpolator circuit 58 because these signals are stored in register 92 using CLK, which logic 90 also uses, and are provided to interpolator 58 using CLKOUT, which is generated by interpolator 58. Interpolator circuit 58 generates CLKOUT by dividing the 240 MHz CLKX4 signal by four; this divided signal is also used for internally clocking portions of interpolator circuit 58. Referring to FIG. 4, divider circuit 106, in conjunction with delay circuit 108, functions as a free running clock for interpolator circuit 58. Delay circuit 108 provides a clock which is delayed by one period (approximately 4 nsec) to the internal circuitry of interpolator circuit 58.

In operation, as long as TG MATCH is low, interpolator circuit 58 is idle because TG MATCH being low causes ENB of enable circuit 102 to be low. When ENB is low, DEC 1 provides all low outputs and LATCH 1 AND LATCH 2 remain at their previous state.

When TG MATCH goes high, enable circuit 102 functions as a one shot, providing a 4.096 nsec pulse. More specifically, when TG MATCH goes high, TGMQ goes high on the next clock from FF17. With TGMQ hiqh, the next clock from BUF2, which is clocking at four times the frequency of the clock from FF17, causes ENB to go high. When ENB goes high LATCH 1, LATCH2 and DEC1 are enabled and FF4 is reset, causing TMGQ to go low, which causes ENB to go low on the next clock cycle. With LATCH 1, LATCH 2 and DEC1 enabled, data are transferred from FF1, FF2 and FF3 to LATCH1, LATCH 2 and DEC1 respectively. This data remains until TG MATCH goes high again.

When enable ENB goes high, pulse swallower circuit 104 receives the two most significant bits of TG RESIDUE. More specifically, these bits provide the inputs for DEC1. DEC1 provides a high output on one of lines PS0-3 depending on the value of TGR8 QA and TGR9 QA. Pulse swallower circuit 104 provides 0-12.288 nsec of delay, thus allowing ramping circuit 114 to only be required to ramp between 0-4.080 nsec rather than between 0-16.368 nsec. More specifically, if both TGR8 QA and TGR9 QA are low, then PS0 is high and PS1-3 are low. Thus, a high need only be clocked through two flip flops (FF11 and FF12) before reaching ORNOR1. Conversely, if both TGR8 QA and TGR9 QA are high, the PS3 is high and PS0-2 are low. Thus, a high is clocked through five flip-flops (FF's 8-12) before reaching ORNOR1. The additional three flip-flops provide an additional 12 nsec of delay.

When a high is provided as the output of FF11 of pulse swallower circuit 104, flip-flops FF6 and FF7 of synchronizing circuit 112 are clocked; thus, providing the DATA QC output to FF14 and the eight least significant bits of TG RESIDUE to digital-to-analog converter DAC1. DAC1 provides an analog output, which is converted to a voltage and provided to the "+" input of COMP1. This input remains constant until FF7 is next clocked.

When a high is provided as the output of FF12 of pulse swallower circuit 104, flip-flop FF14 of synchronizing circuit 112 is clocked and fully differential flip-flop FF13 is provided with a high. The output of FF14 is delayed by DELAY 1 to substantially the same as that of TG OUT and TG OUT*. On the next edge from BUF2, FF13 provides an edge which causes ramping circuit INTI to start ramping. This ramping signal continues until it equals the voltage from current to voltage converter AR1. At this time, a differential edge is provided by COMP1 which causes ONESH1 to provide a precisely timed differential pulse.

In addition to providing TG OUT and DATA OUT, interpolator circuit 58 can be calibrated using an internal calibration circuit 110. More specifically, when the adjust enable input ADJ EN is high, LATCH 3 is enabled and the eight least significant bits of TG RESIDUE are provided to DAC 2. DAC 2 uses this information to adjust the gain of DAC1. The gain of DAC1 can also be adjusted by FS CAL, thus allowing the gain to be externally adjusted. ADJ EN also causes MUX1 to provide the IOUT complement output of DAC1 as the analog DAC OUT output. Accordingly, the output of DAC1 can be measured when a known signal is provided to it.

Referring to FIGS. 7 and 8, in period oscillator 34, before each burst of period information, default circuit 236 resets and synchronizes period oscillators A and B. The default circuit applies period values of zero to both oscillators by addressing multiplexers 234A and 234B with FORCE ZERO A and FORCE ZERO B, which cause the multiplexers to output period values of zero. Because coincidence detectors 212A and 212B are arranged to produce signals that are high only when the output of beginning-of-cycle down counter 210 is one or zero, it can be shown that the BOC A and BOC B signals are stuck high as long as the period value is zero. Consequently, both oscillators A and B are clocked on every clock cycle, once the period value of zero has been clocked through the pipelines. At the same point in time at which default circuit 236 addresses multiplexers 234A and 234B in order to cause period values of zero to be applied to the period oscillators, default circuit 236 also forces the outputs of adders 204A and 204B to zero, thereby clearing the PERIOD RESIDUE feedback loop, and forces coincidence detectors 212A and 212B high, thereby forcing BOC A and BOC B high. The outputs of the adders are kept at zero and the outputs of the coincidence detectors are kept high for an amount of time sufficient to permit the period value of zero to propagate through the pipelines. Once the period value of zero has passed through the pipelines, the adders are no longer forced to zero and the outputs of the coincidence detectors are no longer forced high.

Then default circuit 236 changes the state of FORCE ZERO B, which causes multiplexer 234B to output a default period of one clock cycle. On this clock cycle, multiplexer 234A still outputs a period value of zero. On the next clock cycle default circuit 236 changes the state of FORCE ZERO A. Thus, on this clock cycle and every subsequent clock cycle until the burst begins, default circuit 236 addresses both multiplexers 234A and 234B in a manner such that both multiplexers output the default period.

It can be shown that the first non-zero period value that beginning-of-cycle down counter 210A receives is the default period value, whereas the first non-zero period value that beginning-of-cycle down counter 210B receives is twice the default period. Beginning-of-cycle down counters 210A and 210B receive these first non-zero period values on the same clock cycle. On all subsequent cycles of period oscillators A and B before the burst begins, each of beginning-of-cycle counters 210A and 210B receives a period value of twice the default period, and period oscillators A and B are clocked on alternating clock cycles. It is necessary to apply the first default period to the B oscillator, rather than apply the first default period to the A oscillator, because if the first default period were applied to the A oscillator, the rest of the high-speed data distribution system, which is designed in a manner such that it interprets the first simultaneous BOC A and BOC B after reset as marking an A cycle and the next B cycle, would interpret the output of the oscillator circuit as including two B cycles in a row.

When a burst begins, a rank enable A (RE A) signal is applied to multiplexer 234A, and simultaneously the first period address is applied to random access memory 202A, when the pattern generator is clocked by the output of one-shot 216A. Then a rank enable B (RE B) signal is applied to multiplexer 234B, and simultaneously the next period address is applied to random access memory 202B, when the pattern generator is clocked by the output of one-shot 216B. The rank enable signals cause the multiplexers to output the period values received from random access memories 202A and 202B.

Referring to FIG. 8, once a burst begins, one interpolation circuit within a given local generator circuit produces as an output the signal TG OUT A, which goes high at the beginning of each even cycle. Another interpolation circuit produces as an output the signal TG OUT B. The waveform applied to the device under test (DUT) depends upon the points in time at which either TG OUT A or TG OUT B goes high.

OTHER EMBODIMENTS

Other embodiments are within the following claims.

E.g., interpolator circuit 58 may be used in other systems in which precisely timed output data is desired. In such a system, interpolator circuit 58 may be reset by providing a high on both the ADJ EN and TG RESIDUE 8 lines. A high on both these lines causes AND gate AND1 to provide a high to the reset inputs of flip-flops FF15, FF16 and FF17, thus, resetting the clock signals which clock the entire circuit.

Also e.g., timing generator 10 may provide a signal which is faster than 100 MHz by reducing the maximum difference between rising and falling calibration values.

Also e.g., system 10 may have any number of signal distribution paths. In such a system, divider circuit 32 divides the high speed pattern into as many lower speed patterns as required. Thus, system 10 may be configured to address individual customers specific needs. E.g., if a customer needs an extremely fast system, then more signal distribution paths are provided, or if a customer needs a lower cost system, then the number of signal distribution paths is reduced.

What is claimed is:

1. An apparatus for generating a plurality of high frequency signals for use in testing a device under test comprising
  a pattern generator circuit,
  said pattern generator circuit including
    a high speed address pattern generator that generates high speed address patterns at a high frequency, and
    a divider circuit that is connected to receive said high speed address patterns and splits each said high speed address pattern into a plurality of associated lower speed address patterns at a lower frequency,
  a plurality of local generator circuits that are each connected to receive said associated lower speed address patterns and each generate a high frequency signal based on said associated lower speed address patterns for application to a respective node of said device under test, and
  a plurality of low speed distribution paths connected between said divider and said local generator circuits to provide said lower speed address patterns to said local generator circuits.

2. The apparatus of claim 1 wherein said divider circuit includes means for providing said lower speed address patterns in cycles.

3. The apparatus of claim 2 wherein said divider circuit includes means for providing said lower speed address patterns in a sequence.

4. The apparatus of claim 3 wherein said divider provides two lower speed address patterns, said two lower speed address patterns each having a frequency which is half the frequency of said higher speed address pattern.

5. The apparatus of claim 3 wherein said divider provides four lower speed address patterns, said four lower speed address patterns each having a frequency which is a quarter of the frequency of said higher speed address pattern.

6. The apparatus of claim 1 wherein said divider is configured to provide a certain lower speed address pattern upon receiving a reset signal.

7. The apparatus of claim 6 wherein said reset signal is received when said apparatus is initially turned-on.

8. The apparatus of claim 6 wherein said reset signal is received at the beginning of a burst of said high speed address patterns.

9. The apparatus of claim 8 wherein there are a plurality of bursts of high speed address patterns for a device under test by said apparatus.

10. The apparatus of claim 9 wherein there are between 10 and 200 bursts of high speed address patterns for said device under test.

11. The apparatus of claim 1 wherein each said local generator circuit includes
  a plurality of signal generator circuits configured to operate at said lower frequency and to provide lower frequency signals, and
  a high speed formatter configured to receive said lower frequency signals and to provide said high frequency signal.

12. The apparatus of claim 11 wherein,
  each said signal generator circuit includes
    a plurality of local memories each connected to a said distribution path to be addressed by addresses in a said lower speed address pattern, said memories storing timing information.
    a plurality of timing generators each connected to a respective said memory to receive said timing information read from said memory and generating timing generator information based upon said timing information, and
    a plurality of interpolator circuits each connected to a respective timing generator to receive said timing generator information and generating a said lower frequency signal.

13. The apparatus of claim 12 wherein said timing generator information is provided to said interpolator circuit using a clock signal generated by said interpolator circuit.

14. The apparatus of claim 12 wherein said timing generator information includes signal generator circuit further includes
  a match signal and a residue signal, said match signal being sued by said interpolator circuit to determine when to start generating said lower frequency signal, said residue signal being used to determine when to provide said lower frequency signal.

15. The apparatus of claim 1 wherein
  said divider circuit is configured to receive a first mode select input that selects between a plurality of modes of operation of said divider circuit,
  in a first of said plurality of modes of operation, said divider circuit receives said high-speed address patterns and provides said plurality of lower-speed address patterns at said lower frequency, and
  in a second of said plurality of modes of operation, said divider receives said high-speed address patterns and provides said high-speed address patterns as an output.

16. The apparatus of claim 1, wherein
  said divider circuit is configured to receive a second mode select input that selects between a plurality of modes of operation of said divider circuit,
  in a first of said plurality of modes of operation, said divider circuit receives said high-speed address patterns from said high-speed address pattern generator over a single path, in a second of said plurality of modes of operation, said divider circuit receives said high-speed address patterns from said high-speed address pattern generator over a first path, provides said high-speed address patterns at a first output, receives a second set of high-speed address patterns from a second high-speed address pattern generator over a second path, and provides said second set of high-speed address patterns at a second output.

17. A circuit for producing period information including an edge identification signal, said circuit being arranged for use in conjunction with a reference clock that produces a clock signal, said circuit comprising a plurality of period oscillators, each of said plurality of period oscillators comprising a summation circuit for receiving a plurality of period values representing a corresponding plurality of adjacent time periods, and for summing said period values to produce a summation output, and an edge selector circuit for receiving at least a most significant portion of said summation output, and for producing said edge identification signal, said edge identification signal identifying an edge of said clock signal, said edge being located an integral number of edges away from an edge previously identified by said edge selector circuit, said integral number being determined from at least said most significant portion of said summation output, said plurality of period oscillators being arranged in a manner such that each of a succession of period values representing a corresponding succession of adjacent time periods is received by each said summation circuit of each of said plurality of period oscillators, but each period value in said succession of period values is summed with differing combinations of other period values in said succession of period values by differing summation circuits of each of said plurality of period oscillators.

18. A circuit in accordance with claim 17, wherein said edge selector circuit comprises a counter arranged to receive at least said most significant portion of said summation output, to count a number of clock cycles of said reference clock, said number corresponding to said most significant portion of said summation output, and, upon counting said number of said clock cycles, to produce said edge identification signal.

19. A circuit in accordance with claim 17, wherein said period information includes a residue signal, wherein each of said plurality of period oscillators further comprises a residue circuit for producing said residue signal representative of a residual time from said edge of said clock signal identified by said edge selector circuit, said residual time being determined from a summation of a least significant portion of said summation output and a previous residue signal produced by said residue circuit.

20. A circuit in accordance with claim 19, wherein each of said plurality of period oscillators further comprises a register connected to receive said summation output, said register producing an output that is received by said residue circuit.

21. A circuit in accordance with claim 17 wherein there are two of said period oscillators.

22. A circuit in accordance with claim 17 wherein each of said plurality of period oscillators comprises at least one pipeline-to-pipeline synchronizer for receiving period values and for outputting said period values on a first-in-first-out basis to said summation circuit at times determined by edges of said clock signal selected by said edge selector circuit, said pipeline-to-pipeline synchronizer receiving said period values at times determined by edges of said clock signal selected by an edge selector circuit of another of said plurality of period oscillators.

23. A circuit in accordance with claim 22, wherein each said pipeline-to-pipeline synchronizer of each of said plurality of period oscillators is arranged to receive a mode selection input that forces said pipeline-to-pipeline synchronizer to output period values of zero to said summation circuit when said mode selection input selects an independent operation mode in which one of said plurality of period oscillators operates independently of any other of said plurality of period oscillators.

24. A circuit in accordance with claim 17, further comprising default circuitry for resetting said plurality of period oscillators, said default circuitry being arranged to enable said summation circuits of said plurality of period oscillators to receive a plurality of default values instead of said plurality of period values, said default circuitry causing said default values to be received by said summation circuits in an order and manner such that each of said edge selector circuits of said plurality of period oscillators produces a signal that identifies an edge of said clock signal that is not identified by a signal produced by any other edge selector circuit of any other of said plurality of period oscillators.

25. A circuit in accordance with claim 24, wherein all of said plurality of default values are a same default value.

26. A circuit in accordance with claim 25, wherein said default circuitry is arranged to reset said plurality of period oscillators by applying a period value of zero to each of said plurality of oscillators, then applying said default value to said summation circuit of each of said plurality of period oscillators, and said summation circuits are arranged to receive said default value at differing numbers of inputs of each summation circuit during one cycle of operation of each period oscillator, and to receive said default value at every input during subsequent cycles of operation.

27. A circuit for producing period information including an edge identification signal, said circuit being arranged for use in conjunction with a reference clock that produces a clock signal, said circuit comprising a plurality of period oscillators, each of said plurality of period oscillators comprising a memory for receiving period addressed and for producing a corresponding plurality of period values, a summation circuit for receiving a plurality of period values and for summing said period values to produce a summation output, one of said period values being received from said memory and at least one other of said period values being received from a memory of another of said plurality of period oscillators, said plurality of period values being received from a memory of another of said plurality of period oscillators, said plurality of period values representing a corresponding plurality of adjacent time periods, and an edge selector circuit for receiving at least a most significant portion of said summation output, and for producing said edge identification signal, said edge identification signal identifying an edge of said clock signal, said edge being located an integral number of edges away from an edge previously identified by said edge selector circuit, said integral number being determined from at least said most significant portion of said summation output.

28. A circuit in accordance with claim 27, wherein said plurality of period oscillators are arranged in a manner such that each of a succession of period values representing a corresponding succession of adjacent time periods is received by each said summation circuit of each of said plurality of period oscillators, but each period value in said succession of period values is summed with differing combinations of other period values in said succession of period values by differing summation circuits of each of said plurality of period oscillators.

29. A circuit in accordance with claim 27, wherein said edge selector circuit comprises a counter arranged to receive at least said most significant portion of said summation output, to count a number of clock cycles of said reference clock, said number corresponding to said most significant portion of said summation output, and, upon counting said number of said clock cycles, to product said edge identification signal.

30. A circuit in accordance with claim 27, wherein said period information includes a residue signal, wherein each of said plurality of period oscillators further comprises a residue circuit for producing said residue signal representative of a residual time from said edge of said clock signal identified by said edge selector circuit, said residual time being determined from a summation of a least significant portion of said summation output and a previous residue signal produced by said residue circuit.

31. A circuit in accordance with claim 30, wherein each of said plurality of period oscillators further comprises a register connected to receive said summation output, said register producing an output that is received by said residue circuit.

32. A circuit in accordance with claim 27 wherein there are two of said period oscillators.

33. A circuit in accordance with claim 27 wherein each of said plurality of period oscillators comprises at least one pipeline-to-pipeline synchronizer for receiving said at least one other of said period values from said memory of said another of said plurality of period oscillators and for outputting said at least one other of said period values on a first-in-first-out basis to said summation circuit at a time determined by an edge of said clock signal selected by said edge selector circuit, said pipeline-to-pipeline synchronizer receiving said at least one other of said period values at a time determined by an edge of said clock signal selected by an edge selector circuit of said another of said plurality of period oscillators.

34. A circuit in accordance with claim 33, wherein each said pipeline-to-pipeline synchronizer of each of said plurality of period oscillators is arranged to receive a mode selection input that forces said pipeline-to-pipeline synchronizer to output period values of zero to said summation circuit when said mode selection input selects an independent operation mode in which one of said plurality of period oscillators operates independently of any other of said plurality of period oscillators.

35. A circuit in accordance with claim 27, further comprising default circuitry for resetting said plurality of period oscillators, said default circuitry being arranged to enable each said summation circuit of said plurality of period oscillators to receive a default value instead of a period value, said default circuitry causing default values to be received by said summation circuits in an order and manner such that each of said edge selector circuits of said plurality of period oscillators produces an edge identification signal that identifies an edge of said clock signal that is not identified by a signal produced by any other edge selector circuit of any other of said plurality of period oscillators.

36. A circuit in accordance with claim 35, wherein all of said default values are a same default value.

37. A circuit in accordance with claim 36, wherein
said default circuitry is arranged to reset said plurality of period oscillators by applying a period value of zero to said summation circuit of each of said plurality of oscillators, then applying said default value to said summation circuit of each of said plurality of period oscillators, and
said summation circuits are arranged to receive said default value at differing numbers of inputs of each summation circuit during one cycle of operation of each period oscillator, and to receive said default value at every input during subsequent cycles of operation.

38. An apparatus for generating patterns, comprising
a high-speed pattern generator that generates high-speed period addresses at a high frequency,
a divider circuit that is connected to receive said high-speed period addresses and splits each said high speed address pattern tin to a plurality of lower-speed period addresses at a lower frequency,
a circuit for producing period information including an edge identification signal, said circuit being arranged for use in conjunction with a reference clock that produces a clock signal, said circuit comprising a plurality of period oscillators, each of said plurality of period oscillators comprising
a memory for receiving lower-speed period addresses from said divider circuit, and for producing a corresponding plurality of period values,
a summation circuit for receiving a plurality of period values, one of said period values being received from said memory and at least one other of said period values being received from a memory of another of said plurality of period oscillators, said plurality of period values representing a corresponding plurality of adjacent time periods, and for summing said period values to provide a summation output, and
an edge selector circuit for receiving at least a most significant portion of said summation output, and for producing said edge identification signal, said edge identification signal identifying an edge of said clock signal, said edge being located an integral number of edges away from an edge previously identified by said edge selector circuit, said integral number being determined from at least said most significant portion of said summation output.

39. An apparatus in accordance with claim 38 wherein each of said plurality of period oscillators is arranged in a manner such that each of a succession of period values representing a corresponding succession of adjacent time periods is received by each said summation circuit of each of said plurality of period oscillators, but each period value in said succession of period values is summed with differing combinations of other period values in said succession of period values by differing summation circuits of each of said plurality of period oscillators.

40. An apparatus in accordance with claim 38, wherein said divider circuit cyclically provides said lower-speed period addresses.

41. An apparatus in accordance with claim 40, wherein
said divider circuit provides said lower-speed period addresses in a sequence, and
said sequence is determined by said high-speed period addresses.

42. An apparatus in accordance with claim 41, wherein said divider circuit provides two lower-speed sequences of period addresses.

43. An apparatus in accordance with claim 38, wherein said edge selector circuit comprises a counter arranged to receive at least said most significant portion of said summation output, to count a number of clock cycles of said reference clock, said number corresponding to said most significant portion of said summation output, and, upon counting said number of said clock cycles, to produce said signal that identifies said edge of said clock signal.

44. A circuit in accordance with claim 38, wherein each of said plurality of period oscillators further comprises a residue circuit for producing a residue signal representative of a residual time from said edge of said clock signal identified by said edge selector circuit, said residual time being determined from a summation of a least significant portion of said summation output and a previous residue signal produced by said residue circuit.

45. A circuit in accordance with claim 44, wherein each of said plurality of period oscillators further comprises a register connected to receive said summation output, said register producing an output that is received by said residue circuit.

46. A circuit in accordance with claim 38 wherein there are two of said period oscillators.

47. A circuit in accordance with claim 38 wherein each of said plurality of period oscillators comprises at least one pipeline-to-pipeline synchronizer for receiving said at least one other of said period values from said memory of said another of said plurality of period oscillators and for outputting said at least one other of said period values on a first-in-first-out basis to said summation circuit at a time determined by an edge of said clock signal selected by said edge selector circuit, said pipeline-to-pipeline synchronizer receiving said at least one other of said period values at a time determined by an edge of said clock signal selected by an edge selector circuit of said another of said plurality of period oscillators.

48. A circuit in accordance with claim 47, wherein each said pipeline-to-pipeline synchronizer of each of said plurality of period oscillators is arranged to receive a mode selection input that forces said pipeline-to-pipeline synchronizer to output period values of zero to said summation circuit when said mode selection input selects an independent operation mode in which one of said plurality of period oscillators operates independently of any other of said plurality of period oscillators.

49. A circuit in accordance with claim 38, further comprising default circuitry for resetting said plurality of period oscillators, said default circuitry being arranged to enable each said summation circuit of said plurality of period oscillators to receive a default value instead of a period value, said default circuitry causing default values to be received by said summation circuits in an order and manner such that each of said edge selector circuits of said plurality of period oscillators produces a signal that identifies an edge of said clock signal that is not identified by a signal produced by any other edge selector circuit of any other of said plurality of period oscillators.

50. A circuit in accordance with claim 49, wherein all of said default values are a same default value.

51. A circuit in accordance with claim 50, wherein
said default circuitry is arranged to reset said plurality of period oscillators by applying a period value of zero to said summation circuit of each of said plurality of oscillators, then applying said default value to said summation circuit of each of said plurality of period oscillators, and
said summation circuits are arranged to receive said default value at differing numbers of inputs of each summation circuit during one cycle of operation of each period oscillator, and to receive said default value at every input during subsequent cycles of operation.

52. A circuit in accordance with claim 38, further comprising a plurality of timing generator and interpolation circuits, each of said plurality of timing generator and interpolation circuits being arranged to receive said signal produced by a said edge selector circuit of a corresponding one of said plurality of period oscillators and to produce a timing edge at a point in time determined at least in part by said signal produced by said edge selector circuit.

53. A circuit in accordance with claim 52, wherein
each of said plurality of period oscillators further comprises a residue circuit for producing a residue signal representative of a residual time from said edge of said clock signal identified by said edge selector circuit, said residual time being determined from a summation of a least significant portion of said summation output and a previous residue signal produced by said residue circuit, and
each of said plurality of timing generator and interpolation circuits delays said timing edge by said residual time represented by said residue signal produced by said residue circuit.

54. A circuit in accordance with claim 52, wherein said plurality of timing generator and interpolation circuits are arranged to apply each said timing edge produced by each of said plurality of timing generator and interpolation circuits to a device under test.

* * * * *

UNITED STATES PATENT AND TRADEMARK OFFICE
CERTIFICATE OF CORRECTION

PATENT NO.  : 5,321,700
DATED       : June 14, 1994
INVENTOR(S) : Benjamin J. Brown and Peter A. Reichert It is certified that error appears in the above-identified patent and that said Letters Patent is hereby corrected as shown below:

Column 3, line 27, "s" should be --is--;

Column 3, line 45, after "input" insert --20--;

Column 4, line 34, "ocal" should be --local--;

Column 6, line 55, "throuqh" should be --through--;

Column 9, line 40, "24B" should be --224B--;

Column 10, line 15, "Coincidence" should be --coincidence--;

Column 10, line 53, after "paths" delete ",";

Column 10, line 54, "141" should be --14--;

Column 10, line 59, after "paths" delete ",";

Column 10, line 61, "equals" should be --signals--;

Column 11, line 33, "delayed" should be italicized;

Column 13, line 44, "INTI" should be --INT1--;

Column 14, line 51, "next" should be italicized.

Column 16, line 29, "." should be --,--;

Column 16, lines 44-45, after "includes" delete "signal generator circuit further includes";

UNITED STATES PATENT AND TRADEMARK OFFICE
CERTIFICATE OF CORRECTION

PATENT NO. : 5,321,700

DATED : June 14, 1994

INVENTOR(S) : Benjamin J. Brown and Peter A. Reichert

It is certified that error appears in the above-identified patent and that said Letters Patent is hereby corrected as shown below:

Column 16, line 47, "sued" should be --used--;

Column 18, line 55, "addressed" should be --addresses--;

and

Column 20, line 36, "tin to" should be --into--.

Signed and Sealed this

Eleventh Day of October, 1994

Attest:

BRUCE LEHMAN

Attesting Officer

Commissioner of Patents and Trademarks